US006136621A

United States Patent [19]

Jones et al.

[11] Patent Number: 6,136,621
[45] Date of Patent: Oct. 24, 2000

[54] HIGH ASPECT RATIO GATED EMITTER STRUCTURE, AND METHOD OF MAKING

[75] Inventors: Gary W. Jones, Lagrangeville; Steven M. Zimmerman, Pleasant Valley, both of N.Y.

[73] Assignee: eMagin Corporation, Hopewell Junction, N.Y.

[21] Appl. No.: 09/416,051

[22] Filed: Oct. 12, 1999

Related U.S. Application Data

[62] Division of application No. 08/937,412, Sep. 25, 1997, Pat. No. 5,965,898.

[51] Int. Cl.[7] .................... H01L 21/00

[52] U.S. Cl. .................... 438/20; 445/46; 445/49; 445/50; 445/51

[58] Field of Search .................... 438/20; 445/46, 445/49, 50, 51

[56] References Cited

U.S. PATENT DOCUMENTS

| | | |
|---|---|---|
| 4,964,946 | 10/1990 | Gray et al. . |
| 5,151,061 | 9/1992 | Sandhu . |
| 5,186,670 | 2/1993 | Doan et al. . |
| 5,188,977 | 2/1993 | Stengl et al. . |
| 5,229,331 | 7/1993 | Doan et al. . |
| 5,371,431 | 12/1994 | Jones et al. . |
| 5,378,182 | 1/1995 | Liu . |
| 5,466,982 | 11/1995 | Akinwande . |
| 5,481,156 | 1/1996 | Lee et al. . |
| 5,504,385 | 4/1996 | Jin et al. . |
| 5,514,847 | 5/1996 | Makishima et al. . |
| 5,529,524 | 6/1996 | Jones . |
| 5,548,181 | 8/1996 | Jones . |
| 5,739,628 | 4/1998 | Takada . |

*Primary Examiner*—John F. Niebling
*Assistant Examiner*—David A. Zarneke
*Attorney, Agent, or Firm*—David R. Yohannan; Collier Shannon Scott PLLC

[57] ABSTRACT

A high aspect ratio gated emitter structure and a method of making the structure are disclosed. Emitters may be provided in a densely packed array on a support. Two distinct layers of insulator material may surround the emitters. The lower layer of insulator material may be a non-conformally applied spray-on or spin-on insulator. The non-conformal insulator material may pool at the base regions of the emitters so that the tip regions of the emitters extend out of the lower layer of insulator material. The upper layer of insulator material is applied to the lower layer using a conformal process so that the tip regions of the emitters are covered by the upper layer of insulator material. Gate material is applied to the upper layer of insulator material. Holes are provided in the gate material over the tip regions and wells are provided in the upper layer of insulator material surrounding the tip regions. An etch resistant layer may optionally be provided between the upper layer of insulator material and the gate material.

12 Claims, 4 Drawing Sheets

HIGH ASPECT RATIO GATED EMITTER STRUCTURE, AND METHOD OF MAKING

CROSS-RELATED APPLICATIONS

This application is a divisional of U.S. patent application Ser. No. 08/937,412 filed Sep. 25, 1997 now U.S. Pat. No. 5,965,898.

FIELD OF THE INVENTION

The present invention relates to field emitter structures. More specifically, the invention relates to high aspect ratio field emitters, and methods of making thereof.

BACKGROUND OF THE INVENTION

Microminiature field emitters are well known in the microelectronics art. These microminiature field emitters are finding widespread use as electron sources in microelectronic devices. For example, field emitters may be used as electron guns in flat panel displays for use in aviation, automobiles, workstations, laptops, head wearable displays, heads up displays, outdoor signage, or practically any application for a screen which conveys information through light emission. Field emitters may also be used in non-display applications such as power supplies, printers, and X-ray sensors.

When used in a display, the electrons emitted by a field emitter are directed to an cathodoluminescent material. These display devices are commonly called Field Emitter Displays (FEDs). A field emitter used in a display may include a microelectronic emission surface, also referred to as a "tip" or "microtip", to enhance electron emissions. Conical, pyramidal, curved and linear pointed tips are often used. Alternatively, a flat tip of low work function material may be provided. An emitting electrode typically electrically contacts the tip. An extraction electrode or "gate" may be provided adjacent, but not touching, the field emission tip, to form an electron emission gap therebetween. Upon application of an appropriate voltage between the emitting electrode and the gate, quantum mechanical tunneling, or other known phenomena, cause the tip to emit electrons. In microelectronic applications, an array of field emission tips may be formed on the horizontal face of a substrate such as a silicon semiconductor substrate, glass plate, or ceramic plate. Emitting electrodes, gates and other electrodes may also be provided on or in the substrate as necessary. Support circuitry may also be fabricated on or in the substrate.

The FEDs may be constructed using various techniques and materials, which are only now being perfected. Preferred FED's may be constructed of semiconductor materials, such as silicon. There are two predominant processes for making field emitters; "well first" processes, and "tip first" processes. In well first processes, such as a Spindt process, wells are first formed in a material, and tips are later formed in the wells. In tip first processes, the tips are formed first, and the wells are formed around the tips. There are multitudes of variations of both the well first and the tip first processes. The present invention relates to a tip first process.

The electrical theory underlying the operation of an FED is similar to that for a conventional CRT. Electrons supplied by a cathode are emitted from the tips in the direction of the display surface. The emitted electrons strike phosphors on the inside of the display which excites the phosphors and causes them to momentarily luminesce. An image is produced by the collection of luminescing phosphors on the inside of the display screen. This process is a very efficient way of generating a lighted image.

In a CRT, a single electron gun is provided to generate all of the electrons which impinge on the display screen. A complicated aiming device, usually comprising high power consuming electromagnets, is required in a CRT to direct the electron stream towards the desired screen pixels. The combination of the electron gun and aiming device behind the screen necessarily make a CRT display prohibitively bulky due to the spatial volume required for scanning.

FEDs, on the other hand, may be relatively thin. Each pixel of an FED has its own electron source, typically an array or grouping of emitting microtips. The voltage difference between the cathode and the gate causes electrons to be emitted from the microtips which are in electrical proximity with the cathode. The FEDs are thin because the microtips, which are the equivalent of an electron gun in a CRT, are extremely small. Further, an FED does not require an aiming device, because each pixel has its own electron gun (i.e. an array of emitters) positioned directly behind it.

One problem that has been encountered with FEDs is shorting and voltage leakage between the cathode and the gate along the surface of the insulator that separates the two. To help solve this problem FEDs may be provided with high aspect ratio emitter tips which tends to reduce the likelihood of this shorting and/or surface leakage. High aspect ratio emitters may have a base width to height ratio in the range of 1:1.1 to greater than 1:10. Because high aspect ratio emitters are taller for a given gate hole diameter, the insulator layer between the cathode and the gate can also be made taller, i.e. thicker.

An added benefit of high aspect ratio emitters is that they also tend to enhance the electric field concentration at the tip of the emitter, thereby making the emission of electrons easier (lower turn-on voltage).

Another problem that has been experienced with FEDs is the formation of cracked, broken, or non-uniform metal gate lines on the surface of the insulator between the gate and the cathode. The aforementioned problems with the gate lines may be attributable to an uneven surface of the insulator. The surface of the insulator may be made more even by using a spin-on insulator to fill the steps between the emitters. Spin-on insulators fill the steps or gaps between the emitters by being reflowed (liquified) at high temperatures after being applied. After reflowing, the more even insulator may result in improved gate lines.

Previously used spin-on insulators, such as those used in Doan et al., U.S. Pat. No. 5,229,331 (Jul. 20, 1993) have been reflowed at high temperatures (preferably above 1000° C.). Because of this high reflow temperature, soda lime glass, which begins to flow at 650° C., cannot be used as a substrate in an FED using an insulator that is reflowed at such a high temperature.

OBJECTS OF THE INVENTION

It is therefore an object of the present invention to provide a high aspect ratio gated emitter structure.

It is another object of the present invention to provide a method of making a high aspect ratio gated emitter structure which is of reduced complexity.

It is a further object of the present invention to provide a high density array of field emitters.

It is still another object of the present invention to provide high aspect ratio gated emitter arrays with continuous gate line metal and having reduced gate metal thinning and cracking.

It is yet another object of the present invention to provide high aspect ratio gated emitter structures insulated with a spin-on insulator.

It is still yet another object of the present invention to provide high aspect ratio gated emitter structures on soda lime glass substrates.

Additional objects and advantages of the invention are set forth, in part, in the description which follows and, in part, will be apparent to one of ordinary skill in the art from the description and/or from the practice of the invention.

SUMMARY OF THE INVENTION

In response to the foregoing challenge, Applicants have developed an innovative, and economical method of making a gated emitter structure comprising the steps of: providing an emitter structure on a support; providing a first insulator layer on said support; reflowing said first insulator layer at a temperature less than 300° C. such that a lower region of said emitter structure is covered by the first insulator layer and an upper region of said emitter structure extends out of the first insulator layer; providing a second insulator layer on said first insulator layer such that the upper region of the emitter structure is covered by the second insulator layer; providing a gate layer on said second insulator layer; selectively removing an upper portion of said gate layer such that a surface of said second insulator layer overlying said emitter structure is exposed; and selectively removing a portion of said second insulator layer which is surrounding the upper region of said emitter structure.

Applicants have also developed an innovative and economical gated emitter structure comprising: a high aspect ratio emitter supported on a support substrate, said emitter having a base region and a tip region; a layer of insulator material of a first type surrounding and in contact with the base region of said emitter; a layer of insulator material of a second type forming a well around the tip region of said emitter; and a gate layer overlying said layers of insulator material.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

DETAILED DESCRIPTION OF THE PREFERRED EMBODIMENTS

Figure 1:
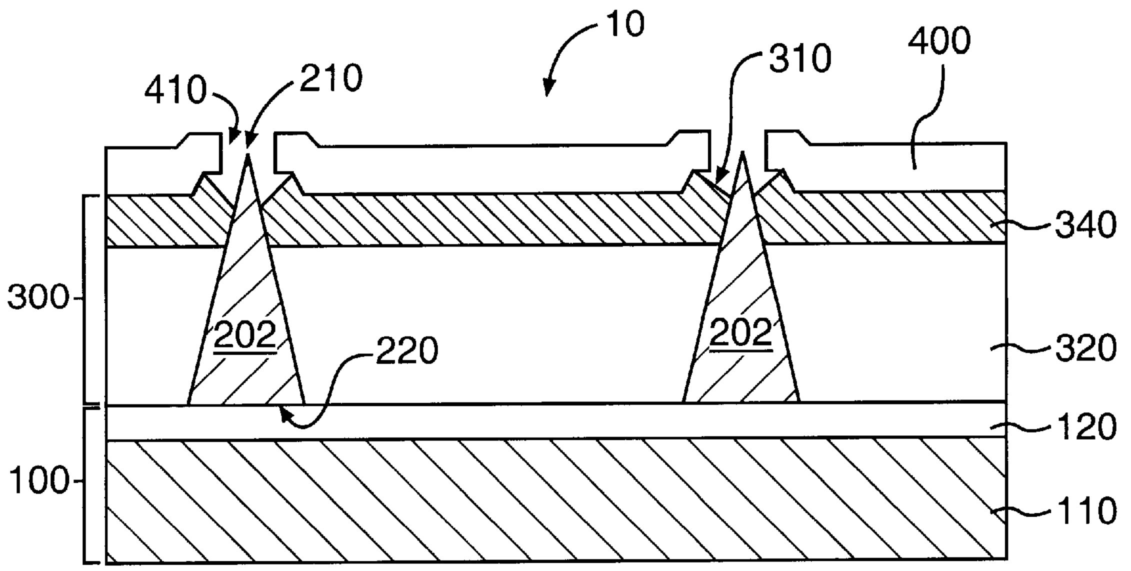
FIG. 1 is a cross-sectional view in elevation of an embodiment of the inventive field emitter during processing.

Reference will now be made in detail to a preferred embodiment of the present invention, an example of which is illustrated in the accompanying drawings. A preferred embodiment of the present invention is shown in FIG. 1 as field emitter 10.

In a preferred embodiment, the field emitter 10 may include four primary components: a support layer 100, emitters 202, an insulator layer 300 and a gate layer 400.

The support layer 100 may comprise plural layers. The support layer 100 may include a substrate 110 made of glass or some other inert material capable of providing a structural support for the field emitter 10. Substrate 110 preferrably may be constructed of a material that is both economical and melts above 500° C., such as soda lime glass. Layered on top of the substrate 110 may be a conductor structure or a combined conductor/current limiter structure 120. There are numerous conductor/current limiter structures 120 which are known in the art, and which may be used with the invention without departing from the scope thereof.

One or more emitters 202 may be provided on the support layer 100, and more specifically on the conductor/current limiter structure 120. The emitters may be formed on the conductor/current limiter structure 120 such that they are in electrical communication with the conductor/current limiter structure. The emitters 202 may have a tip 210, and a base 220. The overall shape of the emitters may be conical, pyramidal, knife-edged, or some other sharp-edged shape. Although the invention is predominantly illustrated hereinafter with reference to embodiments comprising a columnar vertical emitter structure, featuring a sharpened tip, it will be recognized that the emitter structure of the invention may be widely varied, and that in some instances the emitter element may be formed as a knife edge-shaped element providing a twodimensional line source of emitted electrons, as opposed to a focused stream or beam of electrons emitted from a pointed or sharpened tip structure of a columnar emitter.

In the preferred embodiment of the invention, the emitters 202 may be categorized as high aspect ratio emitters. High aspect ratio emitters fall in the range of emitters with a base width (w) to height (h) ratio of approximately 1:1.1 or greater. Particular preference may be to emitters with a base width to height ratio in the range of 1:1.5 to 1:3. The emitters 202 may comprise, for example, Mo, $MoSi_2$, $CrSi_x$, 40–95% Cr+SiO, or any other suitable material.

A significant portion of the emitters 202 may be buried in an insulator layer 300. The upper surface of the insulator layer may be cupped, hollowed, or otherwise deformed in the vicinity 310 of the tips 210 of the emitters 202. The cupped or hollowed portion of the insulator layer 300 may form the "well" for the emitter tip.

The insulator layer 300 may include two or more layers, 320 and 340, of distinct insulator material. The lower insulator layer 320 may be thicker than the upper layer 340, however this is not required for alternative embodiments of the invention. The lower insulator layer 320 may also be applied as a spray-on or spin-on liquid in the preferred embodiment. Because a spray-on or spin-on liquid is better at covering non-uniform features on the substrate and providing an even surface, it is preferable that this layer be the lower of the two or more insulator layers, 320 and 340. It is not mandatory that the spray-on or spin-on layer be the bottom layer because, depending upon the insulator materials used (e.g. SiC), the spray-on/spin-on layer may not be more defect free than the other insulator layer(s).

In the preferred embodiment, application of the lower insulator layer 320 as a liquid allows the layer to fill in the spaces between the emitters 202 because the liquid deposition is a non-conforrnal process. The liquid deposition of the lower insulator layer results in the upper portions of the emitters (the tip regions) being left uncovered by the material of the lower insulator layer (which covers the base regions). The combined thickness of the layers 320 and 340 may be in the range of 0.5 to 5.0 microns, an preferrably about 1 micron. The combined thickness of the insulator layers should be selected to match with the height of the emitters 202.

A gate layer 400 may overlie the insulator layer 300. Holes 410 may be provided in the gate layer 400 in the vicinity 310 of the emitter tips 210. Examples of preferred gate materials include aluminum, chromium, and niobium.

Figure 2A:
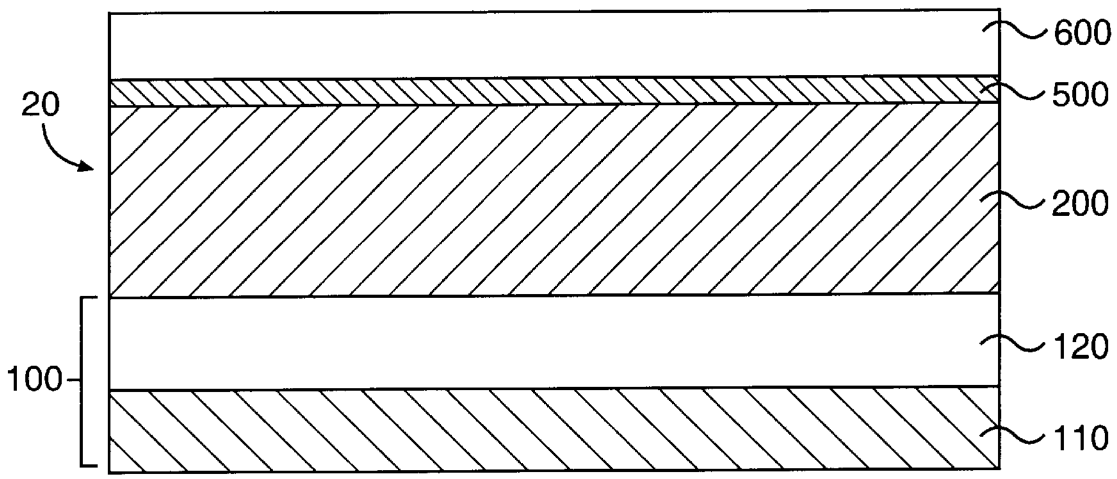
FIG. 2*a* is a cross-sectional view in elevation of a layered structure from which a field emitter may be formed.

A preferred embodiment of the invention may also be explained with reference to the method steps illustrated by FIGS. 2*a*–2*e*, inclusive. With reference to FIG. 2*a*, a preferred field emitter structure may be made starting initially with a multilayered structure 20. Multilayered structure 20 may include a substrate 110, a conductor structure or a combined conductor/current limiter structure 120, an emitter material layer 200, an anti-reflective coating 500, and a layer of photoresistive material 600.

Figure 2B:
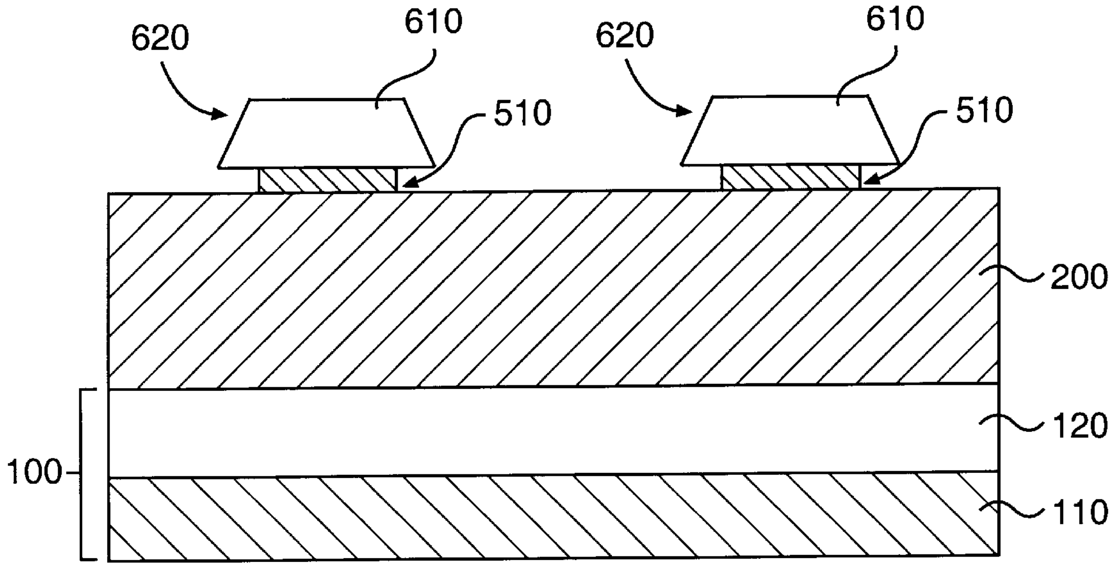
FIG. 2*b* is a cross-sectional view in elevation of the layered structure of FIG. 2*a* after a first processing stage.

With reference to FIG. 2*b*, the photoresistive layer may be selectively masked and exposed to light. Thereafter, selective portions (exposed or unexposed depending on whether the resist is negative or positive) of the resist material may be washed away. The remaining portions of resist material may form a pattern of resist islands 610 on the anti-reflective coating 500. An isotropic etching process may then be conducted on the surface of the multilayered structure 20 such that the anti-reflective coating is etched back under the resist islands 610 to form antireflective islands 510 underlying the resist islands. The undercut of the anti-reflective coating may aid in liftoff of the resist islands 610.

Figure 2C:
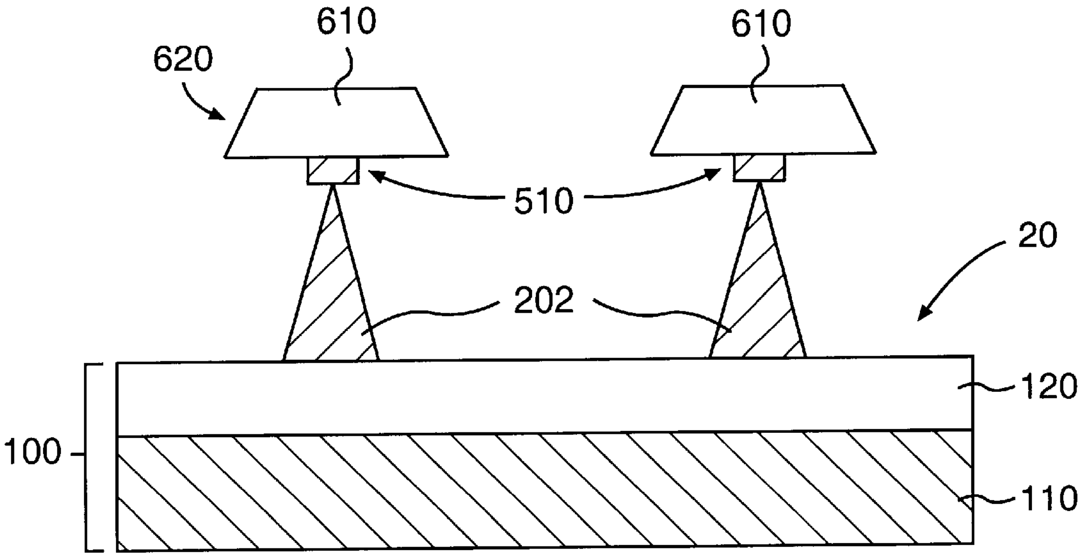
FIG. 2*c* is a cross-sectional view in elevation of the layered structure of FIG. 2*b* after a second processing stage.

With reference to FIG. 2*c*, the layer of emitter material 200 may be etched from above between the caps 620 to form emitters 202. The caps 620, comprised of the anti-reflective islands 510 and the resist islands 610, may or may not fall off following etching of the emitter material. The etch may undercut the anti-reflective islands 510 as it works downward through the emitter material layer 200.

In the preferred embodiment, the etch used for the emitter material may be a reactive ion etch (RIE), such as a $CF_4+O_2$ etching solution. The RIE is very directional and etches straight downward much faster than it etches laterally. RIE produces CO as a byproduct of the etching. The level of CO production is less for lateral RIE than it is for downward RIE. Accordingly, after the downward etching is completed, the CO production of the etching process may drop as only lateral etching continues to occur. The drop off of the CO level may be monitored to determine the point at which all of the undesired emitter material surrounding the emitters 202 has been removed.

The exposed surface of the conductor/current limiter structure 120 between the emitters 202 may be cleaned using an oxygen plasma after the end of the preceding etching step. The oxygen plasma may also oxidize the surface of the emitters 202. Next, the caps 620 may be lifted off if they have not already fallen off during the preceding step. The lift off process may be assisted by wet etching of the emitters 202. Wet etching may also be used to remove the outer oxidized surface of the emitters 202 to thereby sharpen the tips of the emitters. An exemplary wet etching solution comprises aqueous nitric acid and hydrofluoric acid or KOH. After the wet etching step and the removal of the caps 620, the remaining structure 20 may be dried.

Figure 2D:
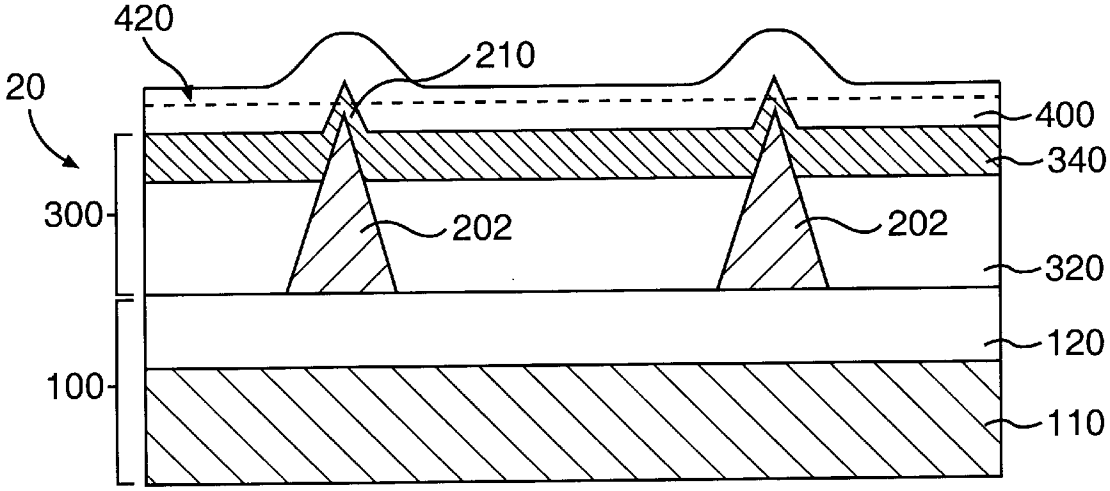
FIG. 2*d* is a cross-sectional view in elevation of the layered structure of FIG. 2*c* after a third processing stage.

With reference to FIG. 2*d*, following the formation of the emitters 202, the first insulator layer 320 can be applied to the upper surface of the structure 20 using a spray-on or spin-on process. In a preferred embodiment, the first insulator layer 320 may be an approximately one (1) micron thick layer of Dow-Corning FOx (flowable oxide). The thickness of the first insulator layer 320 may be varied substantially, however, depending upon the height of the emitters 202. The first insulator layer may typically be in the range of 0.1 to 3.0 microns thick depending on emitter height and the planned thickness of the other insulator layer(s). Use of a spray-on or spin-on insulator enables flexibility with regard to the thickness of the first insulator layer.

Spray-on and spin-on insulator materials are known in the art. For example, Dow-Corning markets a spin-on silicon oxide material under the name FOx. Other exemplary spray-on and spin-on insulators are comprised of silicon sesquioxide material marketed by Allied Signal Corp. The spray-on or spin-on insulator materials contemplated for use with the present invention may be reflowed at temperatures below that of the melting temperature of soda lime glass. Reflowing at these temperatures permits the insulator material to pool around the base regions of the emitters 202 without melting the substrate on which the emitters are formed. After these insulator materials pool, they may be solidified by baking at a temperature below the melting temperature of the substrate. Thereafter the spray-on or spin-on insulator remains solid at normal operating temperatures of the final field emitter structure.

With continued reference to FIG. 2*d*, following the application of the first insulator layer 320, a second insulator layer 340 may be applied to the upper surface of the structure 20. Preferrably a conformal deposition process, such as chemical vapor deposition or plasma enhanced chemical vapor deposition, is used to form the second insulator layer 340. As a result of using a conformal deposition process, the second insulator layer 340 may adhere to the emitter tips 210 which extend out of the first insulator layer 320. The second insulator layer 340 may comprise a silicon dioxide layer approximately 0.6 microns thick in an exemplary embodiment. Other insulator materials which may be used for the second insulator layer include boron and phosphor doped $SiO_2$. The second insulator layer 340 may typically be in the range of 0.1 to 3.0 microns thick.

Figure 3:
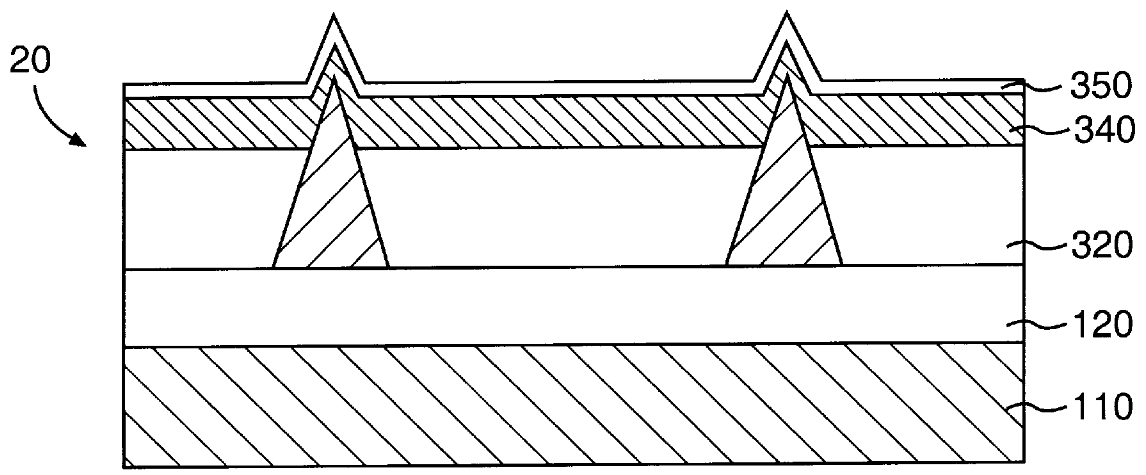
FIG. 3 is a cross-sectional view in elevation of an alternative embodiment of the inventive field emitter.

With reference to FIG. 3, in an alternative embodiment of the invention a layer of etch resistant material 350, such as SiO, $Si_3N_4$, or SiC, can be provided on the second insulator layer 340. The etch resistant layer 350 may be approximately 0.1 microns thick in a preferred embodiment, and may be deposited using a sputtering, evaporation or other process known in the art for depositing such materials. The etch resistant layer 350 can provide additional support for the gate layer (not shown) which is provided on the etch resistant layer.

With renew reference to FIG. 2*d*, following the deposition of the second insulator layer 340 (or the etch resistant layer 350), a gate layer 400 may be provided over the upper surface of the structure 20. The gate layer may be provided by any suitable conductive material, such as chromium. In a preferred embodiment of the invention, the gate layer 400 may be provided by sputtering a 1,500 angstrom thick layer of chromium onto the upper surface of the structure 20.

The gate layer 400 may next be polished using chemical/mechanical polishing so that the upper surface of the structure 20 is planarized along the surface line 420. Polishing the structure 20 results in small areas of the second insulator layer 340, which are above the tips 210 of the emitters 202, being exposed.

Figure 2E:
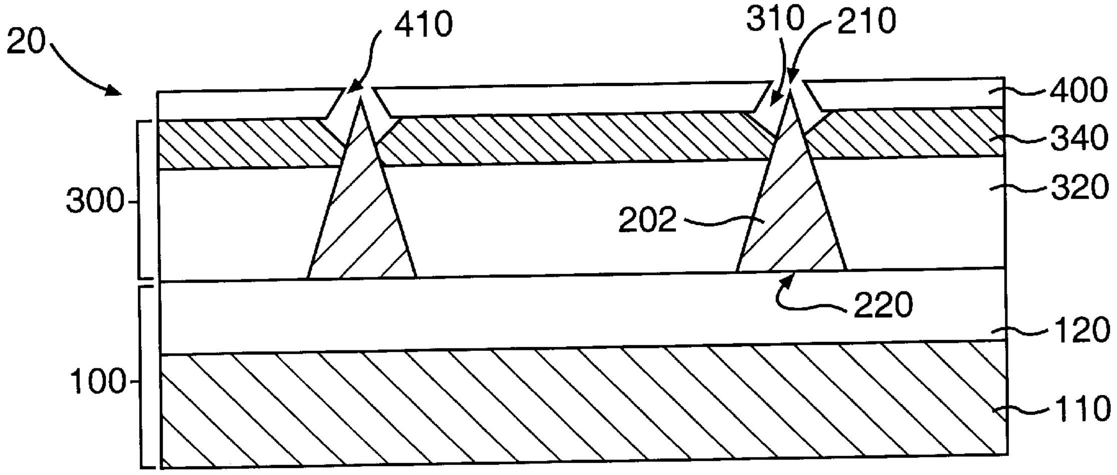
FIG. 2*e* is a cross-sectional view in elevation of the layered structure of FIG. 2*d* after a fourth processing stage.

With reference to FIG. 2*e*, the exposed areas of insulator material below the gate holes 410 may be etched back to form the wells 310 which surround the tip regions 210. The insulator material may be etched back using a wet etch, such as a 10:1 buffered HF solution. To complete the structure, known methods may be used to form the final patterns for the gate lines 400. The first and second insulator layers 320 and 340 may comprise material that is etchable by the same etch so that the wells 310 may selectively extend into the first insulator layer 320.

It will be apparent to those skilled in the art that various modifications and variations can be made in the construction, configuration, and/or operation of the present invention without departing from the scope or spirit of the invention. For example, in the embodiments mentioned above, various changes may be made to the thicknesses of the first and second insulator layers, and to the thickness of the etch resistant layer without departing from the scope of the invention. Variations to the density of emitters, as well as to the shape and size of the individual emitters may also be made without departing from the scope of the invention. Further, it is noted that the reference to a layer, film, or structural element being "on" or "overlying" another layer, film, or structural element means either (i) that the first layer, film, or element is deposited or otherwise formed directly (in contiguous fashion) on the second layer, film or element, or (ii) that the first layer, film, or element is deposited or otherwise formed over (in non-contiguous fashion) the second layer, film, or element with one or more intervening layers, films, or other structural elements between the first and second. Thus, it is intended that the present invention cover the modifications and variations of the invention provided they come within the scope of the appended claims and their equivalents.

We claim:

1. A method of making a gated emitter structure comprising the steps of:

providing an emitter structure on a support;

providing a first insulator layer on said support, wherein said first insulator layer comprises a material selected from the group consisting of spray-on type and spin-on type insulators;

reflowing said first insulator layer at a temperature less than 300° C. such that a lower region of said emitter structure is covered by the first insulator layer and an upper region of said emitter structure extends out of the first insulator layer;

providing a second insulator layer on said first insulator layer such that the upper region of the emitter structure is covered by the second insulator layer;

providing a gate layer on said second insulator layer;

selectively removing an upper portion of said gate layer such that a surface of said second insulator layer overlying said emitter structure is exposed; and selectively removing a portion of said second insulator layer which is surrounding the upper region of said emitter structure.

2. The method of claim 1 wherein the step of providing a first insulator layer comprises the step of depositing a liquid insulator material on said support.

3. The method of claim 2 wherein the step of providing a first insulator layer comprises the further step of spinning said support.

4. The method of claim 2 wherein the step of depositing a liquid insulator material comprises the step of spraying a liquid insulator material on said support.

5. The method of claim 2 wherein a side wall of said emitter structure is sufficiently steep that deposited liquid insulator material flows down the side wall and pools at the lower region of said emitter structure.

6. The method of claim 1 wherein the step of providing a second insulator layer comprises chemical vapor deposition of an insulator material.

7. The method of claim 1 wherein first and second insulator layers comprise $SiO_2$.

8. The method of claim 1 further comprising the step of selectively removing a portion of said first insulator layer.

9. The method of claim 1 further comprising the step of providing an etch resistant layer between said second insulator layer and said gate layer.

10. The method of claim 9 wherein said etch resistant layer comprises a material selected from the group consisting of: SiO and SiC.

11. The method of claim 1 wherein the step of providing an emitter structure on a support comprises the steps of:

providing a layer of emitter material on a support substrate;

providing an anti-reflective coating over said emitter material;

providing a layer of photoresistive material over said anti-reflective coating;

selectively removing a portion of said photoresistive material and said anti-reflective coating to form an island of anti-reflective coating and photoresistive material;

selectively removing a portion of said emitter material to form an emitter structure underlying said island; and lifting off said island from said emitter structure.

12. The method of claim 1 wherein the step of selectively removing the upper portion of the gate layer comprises the step of chemical mechanical polishing.

* * * * *